United States Patent
Sellmair

(10) Patent No.: US 8,076,641 B2
(45) Date of Patent: Dec. 13, 2011

(54) METHOD AND DEVICE FOR PRODUCING AN IMAGE

(75) Inventor: Josef Sellmair, Freising (DE)

(73) Assignee: CarlZeiss NTS GmbH, Oberkochen (DE)

(*) Notice: Subject to any disclaimer, the term of this patent is extended or adjusted under 35 U.S.C. 154(b) by 246 days.

(21) Appl. No.: 12/309,047

(22) PCT Filed: Jun. 22, 2007

(86) PCT No.: PCT/EP2007/005498
§ 371 (c)(1),
(2), (4) Date: Jan. 5, 2009

(87) PCT Pub. No.: WO2008/003405
PCT Pub. Date: Jan. 10, 2008

(65) Prior Publication Data
US 2009/0314937 A1    Dec. 24, 2009

(30) Foreign Application Priority Data
Jul. 6, 2006    (DE) .................. 10 2006 031 643
Aug. 29, 2006   (DE) .................. 10 2006 040 308

(51) Int. Cl.
*H01J 37/26* (2006.01)
*H01J 37/28* (2006.01)

(52) U.S. Cl. ............. 250/310; 250/309; 250/492.1; 250/492.22; 250/492.3

(58) Field of Classification Search ........... 250/309, 250/310, 492.22, 492.3
See application file for complete search history.

(56) References Cited

U.S. PATENT DOCUMENTS

| 4,672,457 | A | * | 6/1987 | Hyatt .................. 348/761 |
| 4,689,555 | A |   | 8/1987 | Brust et al. |
| 4,990,778 | A |   | 2/1991 | Norioka |
| 5,198,668 | A | * | 3/1993 | Yamada ............... 250/310 |
| 5,487,172 | A | * | 1/1996 | Hyatt .................. 712/32 |
| 5,502,306 | A | * | 3/1996 | Meisburger et al. .... 250/310 |
| 5,578,821 | A | * | 11/1996 | Meisberger et al. ... 250/310 |
| 5,665,968 | A | * | 9/1997 | Meisburger et al. ... 250/310 |
| 5,717,204 | A | * | 2/1998 | Meisburger et al. ... 250/310 |
| 5,736,958 | A | * | 4/1998 | Turpin ............... 342/179 |
| 5,751,243 | A | * | 5/1998 | Turpin ............... 342/179 |
| 6,107,637 | A | * | 8/2000 | Watanabe et al. ..... 250/559.3 |
| 6,333,510 | B1 | * | 12/2001 | Watanabe et al. ..... 250/559.27 |
| 6,555,830 | B1 |   | 4/2003 | Mankos et al. |
| 6,965,116 | B1 |   | 11/2005 | Wagner et al. |
| 2004/0033425 | A1 |   | 2/2004 | Koops et al. |
| 2005/0212440 | A1 |   | 9/2005 | Fujieda et al. |
| 2006/0192141 | A1 |   | 8/2006 | Koops |
| 2007/0023672 | A1 | * | 2/2007 | Sellmair ............. 250/396 R |
| 2010/0090579 | A1 | * | 4/2010 | Sellmair ............. 313/160 |

FOREIGN PATENT DOCUMENTS

| DE | 103 02 794 A1 | 7/2004 |
| EP | 0 197 362 A1 | 10/1986 |
| EP | 1 186 079 B1 | 2/2005 |
| JP | 01221849 A | 9/1989 |
| JP | 02262228 A | 10/1990 |

* cited by examiner

*Primary Examiner* — David A Vanore
(74) *Attorney, Agent, or Firm* — Muirhead and Saturnelli, LLC

(57) ABSTRACT

The invention relates to a method and to a device (1) for producing an image of an object (5) by means of a particle beam. According to the method and in the device (1), the particle beam is scanned by the object (5). The aim of the invention is to provide a method and a device for producing an image of an object (5) by means of a particle beam that can be used with a cold field emitter (2) in such a manner that a good image quality is constantly ensured. Said aim is achieved by virtue of the fact that, according to the invention, when a radiation parameter is altered, the object (5) is rescanned preferably with the corrected parameter. The inventive device (1) comprises the corresponding means (4, 6, 7) therefor.

32 Claims, 5 Drawing Sheets

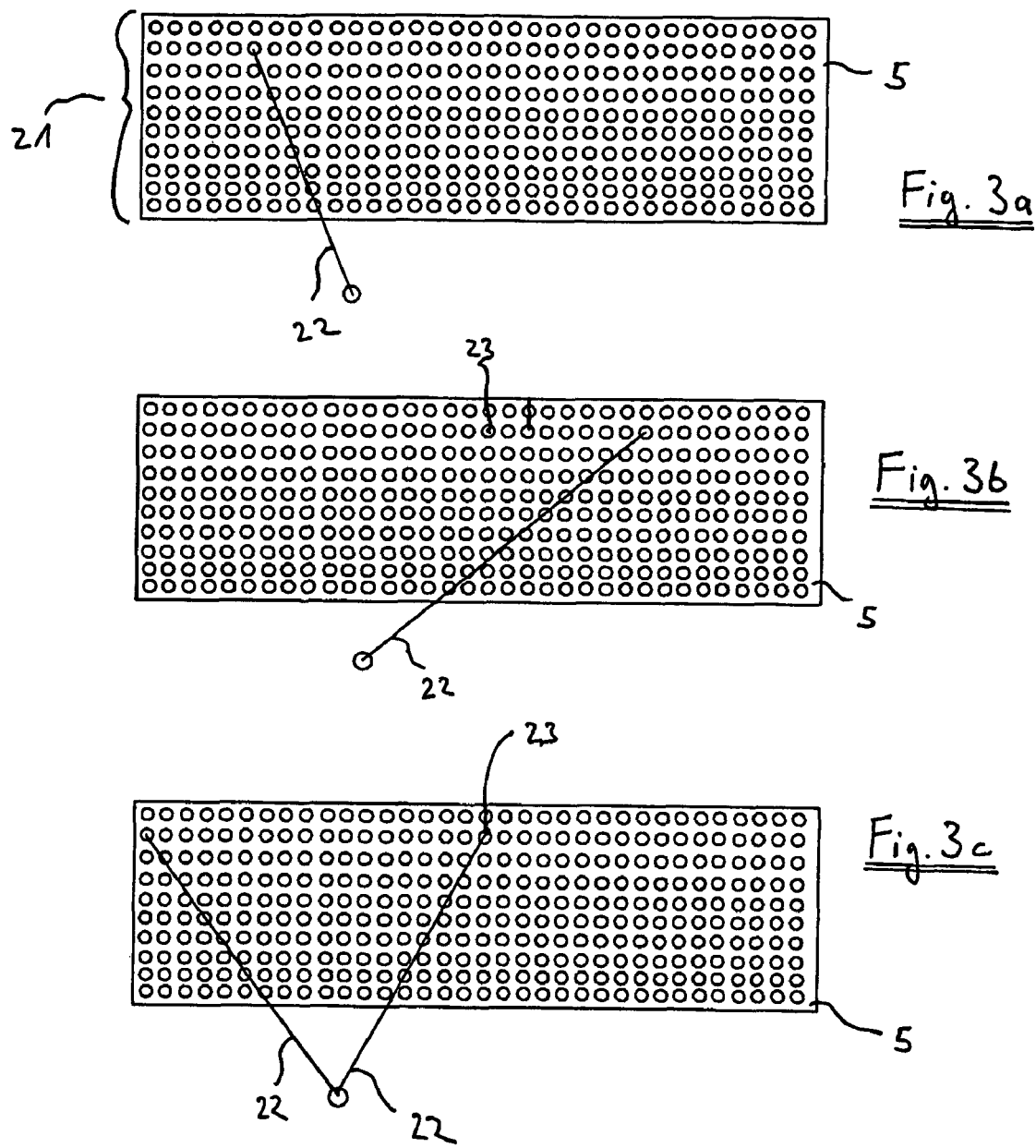

METHOD AND DEVICE FOR PRODUCING AN IMAGE

TECHNICAL FIELD

This application relates to a method and a device for producing an image of an object using a particle beam; in the method or the device, the particle beam may be scanned over the object.

BACKGROUND OF THE INVENTION

A particle beam system may be designed, e.g., as an electron beam system or an ion beam system. The use of an electron beam system in particular is already very widespread. An electron beam system is used, e.g., to manufacture nanostructures. An example of an electron beam system is an electron beam microscope, which has been known for a long time, and using which an image of an object may be created. The two known types of electron beam microscopes are the scanning electron microscope and the transmission electron microscope. The scanning electron microscope is used to create high-resolution images of semiconductor structures, biological and mineralogical samples, and other samples.

An electron beam system (also referred to as an electron beam device) such as the scanning electron microscope includes a particle beam generator in the form of an electron beam generator for producing an electron beam, an objective lens for focusing the electron beam on the object, and at least one detector for detecting electrons that are scattered on the object or that are emitted from the object. The electron beam produced by the particle beam generator is focused via the objective lens on the object to be investigated. Using a deflection device, the electron beam is guided in a scanning pattern over the surface of the object to be investigated. The electron beam is therefore scanned over the surface of the object. The electrons of the electron beam interact with the object. As a result of the interaction, electrons, in particular, are emitted from the object surface ("secondary electrons"), or electrons from the electron beam are reflected back ("backscattering electrons"). Secondary electrons and backscattering electrons may be detected using the detector. The detector detects a detector signal depending on the detected secondary electrons and backscattering electrons. The detector signal is used to create an image.

Thermal field emitters or cold field emitters, for example, may be used as the particle beam generators (which are also referred to below as a particle beam source). The use of field emitters of this type has been known for a long time. Cold field emitters that are miniaturized have been used for various applications over the past few years. DE 103 02 794 A1, for example, describes miniaturized electron beam systems having cold field emitters, which are also miniaturized, and which are manufactured using electron beam-induced deposition. In addition, EP 1 186 079 B1 describes a miniaturized electron beam source that operates in the terahertz range.

Cold field emitters have high beam directionality and a low beam energy width. They are therefore particularly well-suited for attaining very small electron beam diameters, thereby making it possible to attain a high resolution. They have the disadvantage, however, that their electron emission current fluctuates over time. The fluctuations over time in the electron emission current become apparent as disturbing light or dark strips in the line grid image when an object is imaged, e.g., in a scanning electron microscope. This is an undesired phenomenon.

Accordingly, it would be desirable to provide a method and a device for producing an image of an object using a particle beam, the method and device being used with a cold field emitter in a manner such that good image quality is always ensured.

SUMMARY OF THE INVENTION

According to the system described herein, a method for producing an image of an object using a particle beam produces the image by scanning the particle beam over the object. To improve the image quality, a parameter associated with the particle beam is determined. It is also determined if the parameter changes. If a change has occurred in the parameter, the location on the object at which the change occurred in the parameter is determined. The particle beam is then returned to this location. The particle beam is then rescanned over the object from this location onward.

The system described herein may be based on the finding that the property of a particle beam generator, in particular a cold field emitter, to only show abrupt changes in the emission current and to show a constant emission current between these abrupt changes may be used to advantage to create images. With particle beam generators, the emission current typically changes abruptly within a very short period of time, usually less than a microsecond. After an abrupt change takes place, the emission current remains stable for a certain period of time before it "jumps" again. The system described herein may be based on responding to a determination that a change has occurred in the emission current, and on taking steps to improve the image quality. If it is determined that the emission current of the particle beam generator has changed, the location at which the change in emission current took place is determined immediately. The particle beam is returned to this location, and the particle beam is rescanned over the object from this location onward. The faulty image information that was obtained from scanned image points of the object is deleted and replaced with the information that is obtained in the rescanning. The rescanning procedure has a negligible impact on the time required to capture an image.

In the method according to an embodiment of the system described herein, the parameter is preferably changed to a setpoint value after it is determined that a change has occurred in the parameter. For example, when it is determined that a change has occurred in an emission current of an emitter, the emission current is changed to a setpoint value, thereby ensuring that the quality of the imaging is always sufficiently high, and, in particular, that the brightness of the image is of good quality and is sufficient.

The location at which the change occurred in the parameter is determined, e.g., using a calculation of time, preferably with consideration for the point in time at which the change was detected, the speed of the scanning by the particle beam, and/or signal transit times.

The magnitude of the change in the parameter that results in the particle beam being returned may be set. A threshold value may thus be seta This ensures that every minimal fluctuation of the parameter does not result in the particle beam being returned, and only that significant changes result in the particle beam being returned.

In a particular embodiment of the method according to the present invention, the parameter is integrated over a specified period of time, and only then is it determined whether a change has occurred in the parameter. This procedure is advantageous, in particular, when observing low-intensity parameters. To obtain an adequate signal with a high signal-to-noise ratio, the parameter is integrated over a certain period of time.

In a further exemplary embodiment of the method according to the present invention, the particle beam is scanned over the object from a first point of a specified pattern to a second point of the specified pattern. If it is determined that a change has occurred in the parameter, the particle beam is not returned to the location where the change occurred in the parameter until the particle beam has reached the second point of the specified pattern during the scanning process. In this exemplary embodiment, therefore, the particle beam is not rescanned over the object until the specified pattern has been scanned between two points. The first point is preferably the beginning of the specified pattern, and the second point is considered to be the end of the specified pattern.

The specified pattern is, e.g., a row (image line) or a column (image column). The correction is carried out after this row or column has been scanned. As an alternative, it is provided that several consecutive rows or columns are used as the pattern. The system described herein is not limited to a row-based or column-based pattern, however. Instead, it is possible to use any pattern that may be used for scanning, i.e., recording data from point to point on an object.

In a particular embodiment of the method according to the present invention, a current of the particle beam (also referred to as the particle beam current or particle current) is determined as the parameter. For example, the particle beam current is the emission current of electrons from a cold field emitter.

In a further embodiment of the method according to the present invention, the particle beam is scanned over the object using a scanning means, which is controlled by an evaluation unit. Preferably, the parameter, and—as an alternative or in addition thereto—the location at which the change occurred in the parameter are determined using the evaluation unit.

In another embodiment of the method according to the present invention, the particle beam is designed as an electron beam, which is scanned over the object in order to create an image.

It may be provided that the particle beam is produced using a cold field emitter. For this purpose, it is possible in particular to use a miniaturized cold field emitter, since this type of field emitter requires smaller voltage changes in order to control the particle beam (electron beam) than does a macroscopic emitter. For example, the particle beam is produced using a deposited cold field emitter, which is understood to be a miniaturized cold field emitter that was manufactured, e.g., using electron beam-induced deposition.

In a further embodiment of the method according to the present invention, the particle beam is guided to at least one raster point, where an integrating measurement is carried out. For example, during scanning, a particle beam is guided over the object to the raster point, where a measurement is performed repeatedly using the particle beam, and the measured values obtained in this manner are integrated in order to calculate the mean (pixel integration). The integrating measurement may also be carried out for all raster points located in one raster line (line integration). As an alternative, the integrating measurement may also be carried out for several raster lines, each of which includes raster points, and which are combined to form a single unit (frame integration). If it is determined in the pixel integration that a change has occurred in the parameter at the aforementioned raster point, the particle beam is returned to this raster point. If it is determined in the line integration that the change occurred in the parameter at one of the raster points in the raster line, the particle beam is returned to this raster point or another raster point in the raster line that is located before the raster point at which the change occurred in the parameter (e.g., the first raster point in the raster line, i.e., the beginning of the raster line). The same applies to the frame integration, in which case it is also provided that the particle beam is returned to the raster point at which the change occurred in the parameter, or it is returned to another raster point in the frame located before this raster point (e.g., the beginning of one of the raster lines). In all of the exemplary embodiments, the rescanning is started once the particle beam has returned.

In a further embodiment of the method according to the present invention, it is provided that the brightness and contrast of the generated image are adjusted. The brightness and contrast are adjusted automatically, for example. If a change occurs in the parameter of the particle beam, the brightness is adjusted. Abrupt changes in brightness are largely prevented by using the method described of returning the particle beam to the location of the change and repeating the scanning procedure.

The method according to an embodiment of the system described herein may be used in a particle beam device, e.g., an electron beam device, which is described in greater detail below.

According further to the system described herein, a device for producing an image of an object uses a particle beam which is scanned over the object. The device according to system described herein is designed, in particular, to carry out a method having at least one of the aforementioned features or combinations of features. The device includes at least one particle beam generator for producing a particle beam, at least one scanning means for scanning the particle beam over the object, at least one means for determining a parameter assigned to the particle beam, at least one means for determining that a change has occurred in the parameter, at least one means for determining a location on the object at which the change has occurred in the parameter, and at least one means for returning the particle beam to this location.

In the device according to an embodiment of the system described herein, the particle beam that is scanned over the object using the scanning means is produced using the particle beam generator. It is possible to determine the location at which the parameter changed by using the means for determining the parameter associated with the particle beam, and by using the means for determining whether a change has occurred in the parameter. This is carried out, e.g., using the calculation of time described above. The particle beam is then returned to this location and the rescanning of the object is started, as described above.

In the device according to an embodiment of the system described herein, it may be provided that a means is provided for changing the parameter to a setpoint value, the means being used to change the parameter as described above.

The device according to an embodiment of the system described herein may also include a means for setting a threshold value for the parameter change. In this manner, it is ensured that—as described above—every minimal change in the parameter does not result in the particle beam being returned.

In one embodiment of the device according to the present invention, the means for returning the particle beam is situated in the scanning means. The means for returning the particle beam and the scanning means are preferably identical in design. They therefore form a single unit.

It is also preferably provided that the means for determining the parameter associated with the particle beam is designed as a means for determining the particle beam current. The emission current of a cold field emitter that is used as the parameter is therefore measured, for example.

The means for determining the parameter associated with the particle beam is located between the particle beam generator and the object. As an alternative, it is provided that the means for determining the parameter assigned to the particle beam is integrated in the particle beam generator. For example, the means for determining the parameter is located in an electron beam column between a cold field emitter and an object, the emission current of the cold field emitter being used as the parameter in this case.

In a further embodiment of the device according to the present invention, the means for determining that a change has occurred in the parameter is situated in the means for determining the location. It is preferably provided that the means for determining a change that occurred in the parameter, and the means for determining the location are designed to be identical, i.e., they are designed as one unit.

In another embodiment of the device according to the present invention, the means for determining the parameter, and/or the means for determining that a change has occurred in the parameter, and/or the means for determining the location on the object, and/or the means for returning the particle beam is/are connected with each other. The means for determining the parameter, the means for determining that a change has occurred in the parameter, and/or the means for determining the location on the object may be accommodated in an evaluation unit.

It may also be provided that the means for changing the parameter is connected to the particle beam generator.

In a further embodiment of the present invention, the device is provided with a means for performing an integrating measurement, as described above. It may also be provided that the device includes a means for adjusting the brightness and/or contrast of the image that was created.

In a further embodiment of the present invention, the particle beam generator is designed as an electron beam source. The device is therefore an electron beam device, e.g., of the type described below.

According further to the system described herein, an electron beam device may be provided, in particular a scanning electron microscope, to create an image of an object using an electron beam, the electron beam being scanned over the object. The electron beam device according to an embodiment of the system described herein includes at least one electron beam source for producing an electron beam, at least one objective lens for focusing the electron beam onto the object, at least one scanning means for scanning the electron beam over the object, at least one means for determining a parameter assigned to the electron beam, at least one means for determining that a change has occurred in the parameter, at least one means for determining a location on the object at which the change occurred in the parameter, and at least one means for returning the electron beam to this location.

It is also provided to locate a means for changing the parameter to a setpoint value on the electron beam device according to an embodiment of the system described herein.

BRIEF DESCRIPTION OF THE DRAWINGS

The system described herein is explained below in greater detail with reference to exemplary embodiments using figures.

FIGS. 3a through 3c show a schematic depiction of an object having raster image points;

DETAILED DESCRIPTION OF VARIOUS EMBODIMENTS

Figure 1:
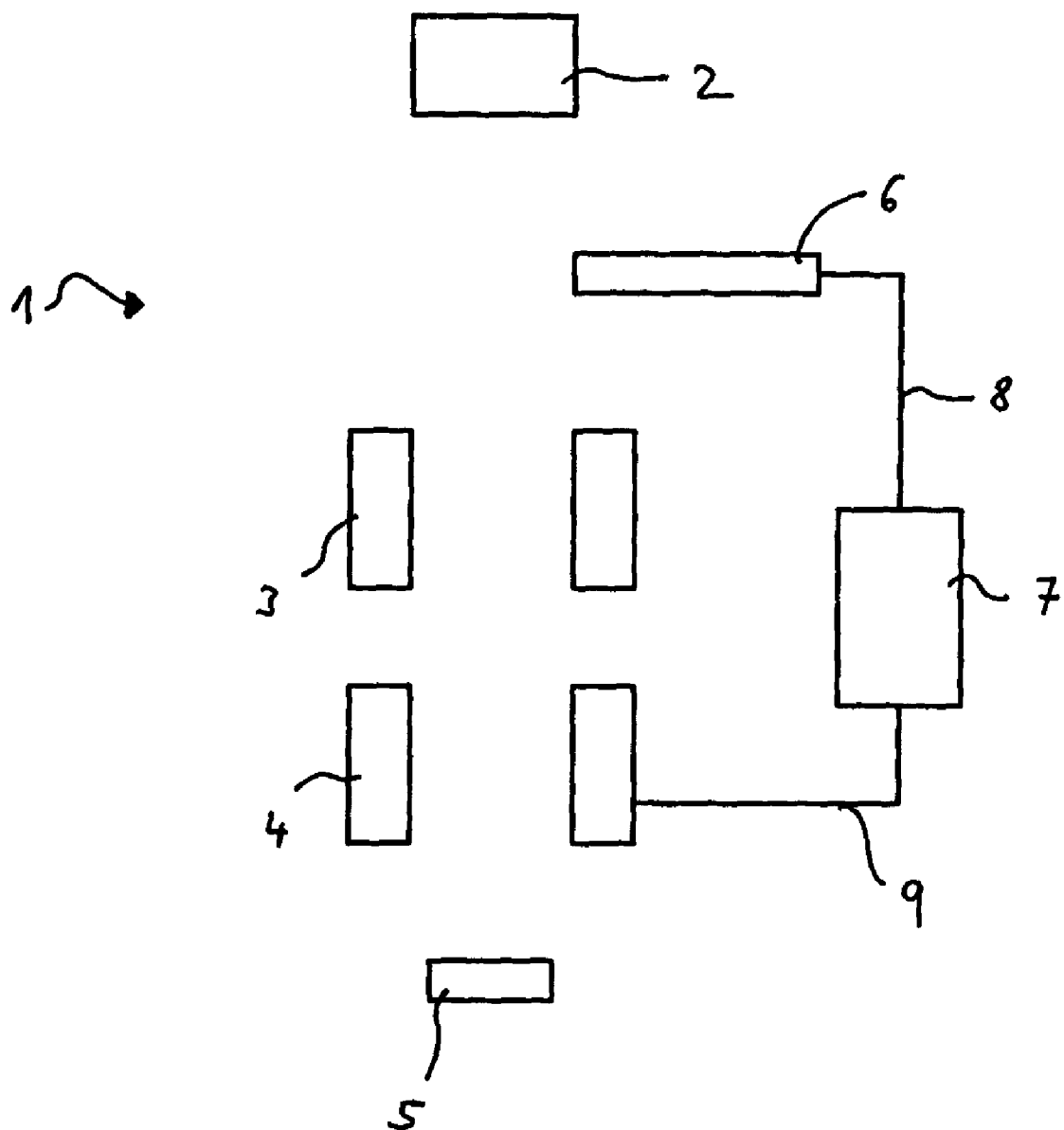
FIG. 1 shows a schematic depiction of a particle beam device.

Various embodiments of the system described herein will now be explained in general with reference to a particle beam device 1. FIG. 1 shows the schematic depiction of particle beam device 1. Particle beam device 1 includes a beam source 2 (beam generator), using which a particle beam is generated. The particle beam is introduced into a particle beam column (not depicted), and it is focused onto an object 5 using an objective lens 3. A scanning means 4 is provided in order to scan the particle beam over object 5. It is expressly pointed out that the relative placement of objective lens 3 and scanning means 4 is merely a schematic depiction. The actual placement of objective lens 3 and scanning means 4 relative to each other may be entirely different from that which is shown.

The particle beam scanned over object 5 using scanning means 4 interacts with object 5 and generates interaction particles, which are detected via a detector (not depicted) and are used to create an image.

Particle beam device 1 also includes a particle current measuring device 6, which is located between particle generator 2 and objective lens 3. As an alternative, it is provided that the particle current measuring device is integrated in beam generator 2. Particle current measuring device 6 is connected via a line 8 to an evaluation unit 7. In addition, evaluation unit 7 is connected via a line 9 to scanning means 4. It is also possible to use evaluation unit 7 to set a threshold value for the change in the particle current. If the change in the particle current exceeds this threshold value, this causes the particle beam to be returned, as described below.

The particle current of the particle beam generated by beam generator 2 is measured using particle current measuring device 6. The particle current and its value determined in this manner are forwarded via line 8 to evaluation unit 7. Evaluation unit 7 is provided with a control program in such a way that evaluation unit 7 may determine whether a value of the particle current that was just measured has changed compared to a previously measured value of the particle current. For this purpose, evaluation unit 7 is provided with a microprocessor (not depicted) and memory components (not depicted), in which, in particular, the control program and values of the particle current are stored, or are continually saved. As soon as evaluation unit 7 has determined that a change has occurred in the particle current (the threshold value has been exceeded), the location of object 5 at which the particle beam was located when the particle current changed is determined via a time calculation. The particle beam is then returned to this location. For this purpose, evaluation unit 7 sends appropriate control signals via line 9 to scanning means 4, which returns the particle beam to the location. The scanning of object 5 is then repeated starting at this location, and it is continued from this location onward. The faulty image information that was obtained from scanned image points of object 5 is deleted and replaced with the information that is obtained in the rescanning procedure.

Figure 2:
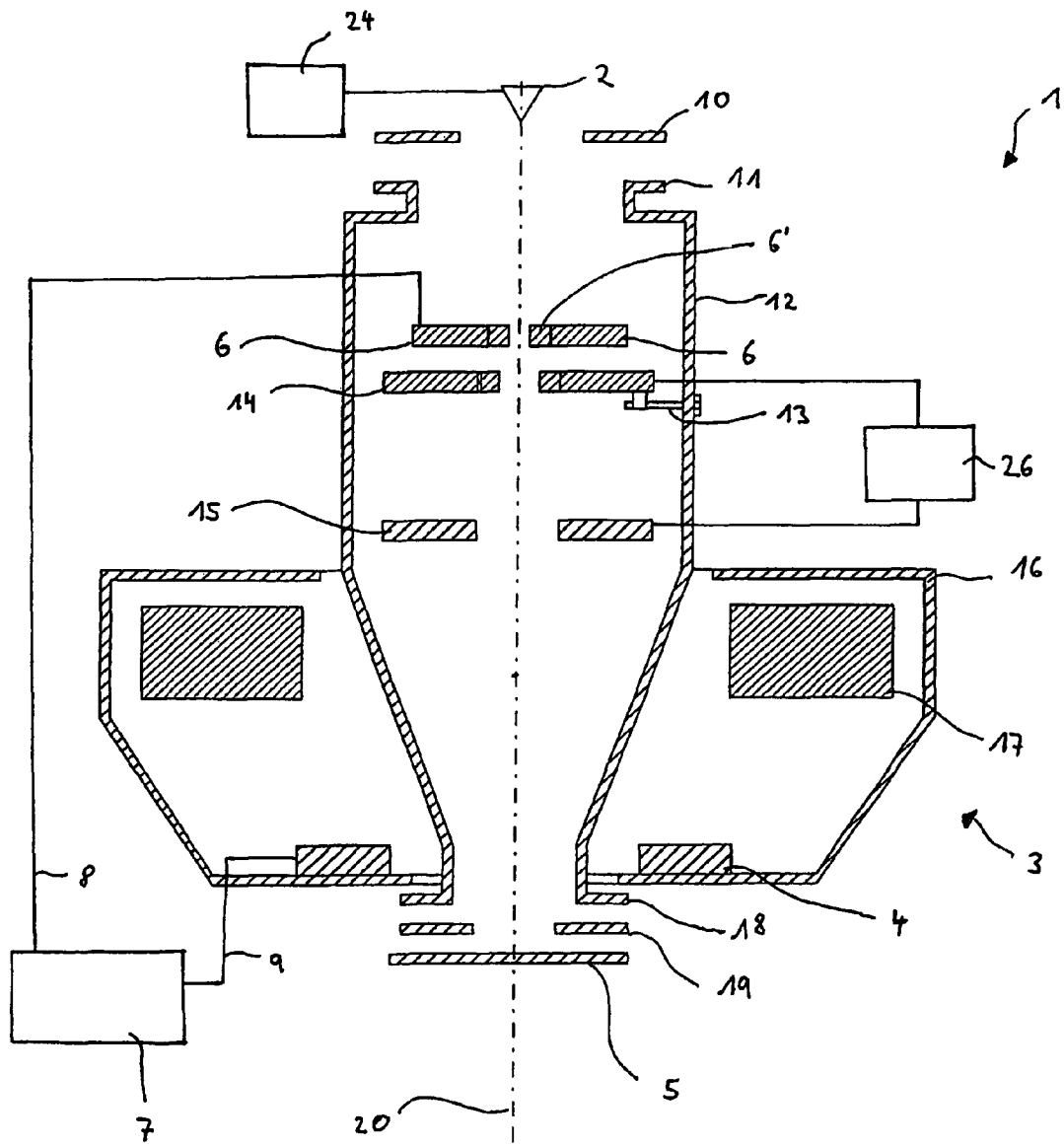
FIG. 2 shows a schematic depiction of an electron beam device designed as a scanning electron microscope.

FIG. 2 shows a particular embodiment of the device according to the present invention, which is designed as an electron beam device in the form of a scanning electron microscope 1. It includes a beam source 2 in the form of a cold field emitter, an extraction electrode 10, and an anode 11, which is also one end of a beam guide tube 12 of scanning electron microscope 1. Electrons that exit beam source 2 are accelerated to anode potential due to a potential difference between beam source 2 and anode 11.

Beam guide tube 12 passes through a bore formed through pole shoes 16 of a magnetic lens acting as objective 3. Coils 17 are located in pole shoes 16. An electrostatic retardation device is connected downstream from beam guide tube 12. The electrostatic retardation device is composed of an electrode 19 and a tube electrode 18 formed on the end of beam guide tube 12 situated opposite an object 5. Tube electrode 18 and beam guide tube 12 are therefore at anode potential, while electrode 19 and object 5 are at a potential that is lower than the anode potential. In this manner, the electrons in the electron beam exiting beam source 2 may be slowed to a desired low energy that is required to investigate object 5. A scanning means 4 is also provided, via which the electron beam may be deflected and scanned over object 5.

To detect secondary electrons or backscattered electrons produced via the interaction of the electron beam generated by beam source 2 with object 5, a detector system having a first detector 14 and a second detector 15 is located in beam guide tube 12. Detector 14 is located in beam guide tube 12 in such a way that it is movable along optical axis 20 using an adjusting device 13. First detector 14 and second detector 15 each include an annular detection surface. It is expressly pointed out that the present invention is not limited to the use of two detectors. Instead, the present invention may always include only one detector or more than two detectors. In addition, the detector or detectors need not be located in such a way that they are movable. Detectors 14 and 15 are connected to an evaluation unit 26, using which integrating measurements may be carried out in particular. For example, the electron beam is guided to a raster point at which a measurement is performed repeatedly using the electron beam, and the measured values obtained in this manner are integrated in order to calculate the mean (pixel integration). The integrating measurement may also be carried out for all raster points located in one raster line (line integration). As an alternative, the integrating measurement may also be carried out for several raster lines, each of which includes raster points, and which are combined to form one unit (frame integration).

Scanning electron microscope 1 also includes a particle current measuring device 6, which is provided to measure the current of the electron beam. In this exemplary embodiment, particle current measuring device 6 is provided with a sensitive region 6'. Particle current measuring device 6 is connected via a line 8 to an evaluation unit 7, which, in turn, is connected via a line 9 to scanning means 4.

Scanning electron microscope 1 operates using the method according to the present invention, as explained above with reference to the exemplary embodiment depicted in FIG. 1. In this regard, reference is made to the explanations provided above. Scanning electron microscope 1 also includes a change means 24, which is connected with beam source 2. Once it has been determined that a change occurred in the current of the electron beam (electron current), the electron current is changed to a setpoint value. This ensures that the newly created images have no abrupt changes in brightness, and that they are neither too light nor dark. Of course, change means 24 may also be designed as shown in the embodiment in FIG. 1.

FIGS. 3a through 3c show a schematic depiction of an object 5, on which the raster image points are depicted schematically, the raster image points having been scanned using the particle beam according to the exemplary embodiment shown in FIG. 1, or using the electron beam according to the exemplary embodiment shown in FIG. 2. Reference numeral 21 labels the various rows of raster image points on object 5. The particle beam or electron beam 22 is guided over object 5 in such a way that it approaches each raster image point in a row 21 in succession, thereby "scanning" them. FIG. 3a shows the position of the particle beam or electron beam 22 when a first raster image point in a row 21 is scanned. FIG. 3b shows the position of the particle beam or electron beam 22 when a further raster image point in the same row is scanned.

If it is determined that the particle current or electron current 22 has changed, the location is determined at which the change occurred in the particle current or electron current 22. This location is the raster image point labeled with reference numeral 23 in FIG. 3b. After this location is determined, the particle beam or electron beam 22 is guided via the scanning means back to raster image point 23 (FIG. 3c). The scanning of row 21 in which raster image point 23 is located is then continued from raster image point 23 onward. All previous information that was obtained by scanning from raster image point 23 to the raster image point at which the scanning procedure was interrupted and the particle beam or electron beam 22 was returned is discarded and replaced with the information obtained in the repeated or new scanning procedure.

Figure 4A:
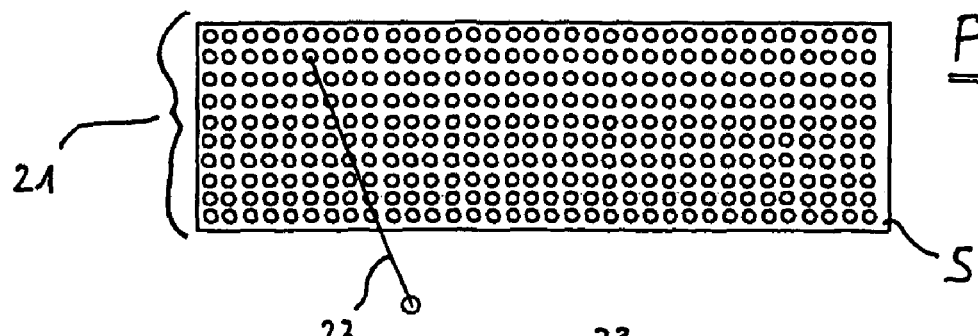
FIGS. 4a through 4d show a further schematic depiction of an object having raster image points.
Figure 4B:
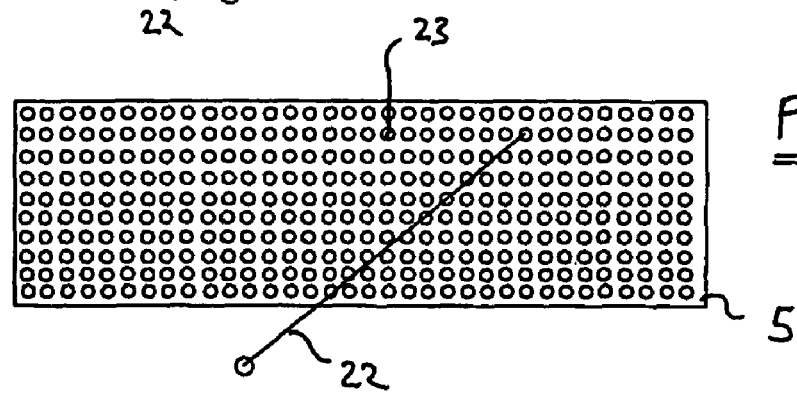
Figure 4C:
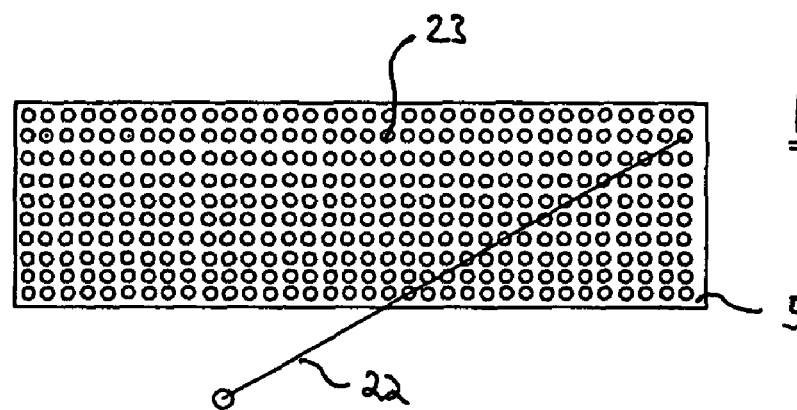

The same applies for the exemplary embodiment depicted in FIGS. 4a through 4d. In this case, in contrast to the exemplary embodiment depicted in FIGS. 3a through 3c, the scanning of the rows is continued after it is determined that a change has occurred in the particle current or the electron current (FIG. 4b), and the particle beam or electron beam 22 is returned to raster image point 23 only after entire row 21 has been scanned (FIG. 4c).

Figure 4D:
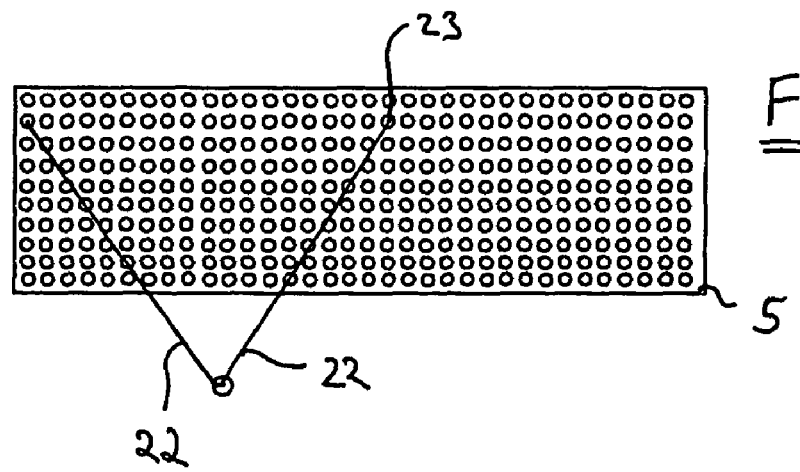

As an alternative to returning to raster image point 23, it may be provided in both exemplary embodiments for the particle beam or electron beam 22 to not be guided to raster image point 23, but rather to the beginning of row 21, in which raster image point 23 is located. This is also depicted in FIGS. 3c and 4d. In this exemplary embodiment, the entire row 21 is therefore rescanned. The present invention is therefore not limited to returning the particle beam only to the raster image point (raster image point 23 in this case) at which the change occurred in the parameter of the particle beam (the particle beam current in this case). Instead, the particle beam may also be guided to a further raster image point that is located before the raster image point at which the change occurred. The only essential point is that rescanning is also carried out at the raster image point at which the change occurred in the parameter of the particle beam current.

Figure 5A:
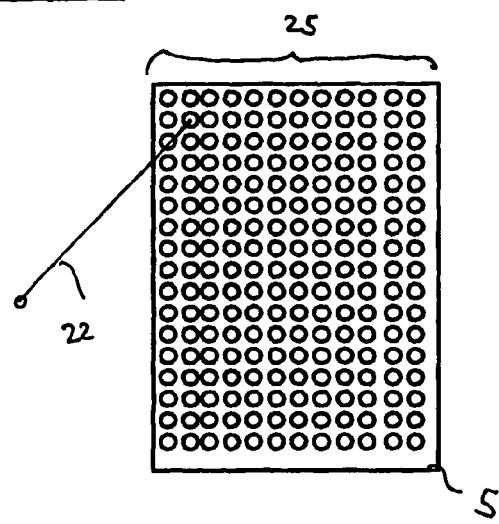
FIGS. 5a through 5c show a further schematic depiction of an object having raster image points.
Figure 5B:
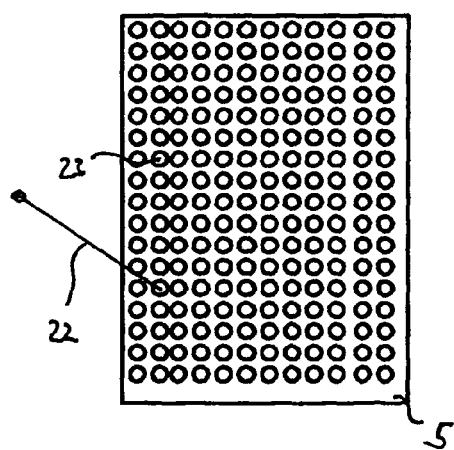
Figure 5C:
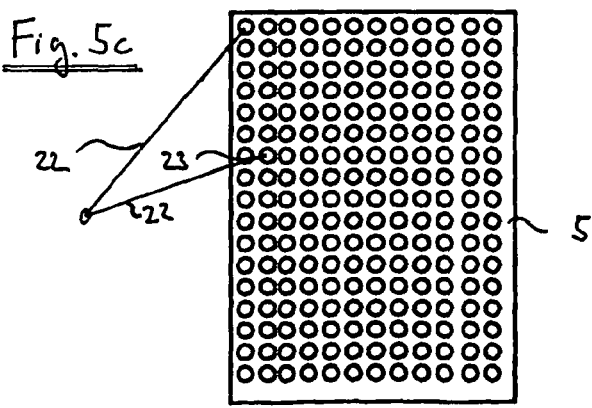

FIGS. 5a through 5c show an object that is being scanned in columns 25. The same descriptions that were provided for the exemplary embodiments depicted in FIGS. 3a through 3c, and 4a through 4d, also basically apply here.

The method described below may also be used, in particular, in the exemplary embodiments shown. If it is determined via pixel integration that a change occurred in the particle current or the electron current at raster image point 23, the particle beam or electron beam 22 is returned to raster image point 23. If line integration is carried out and it is determined that the change in the particle current or the electron current occurred at raster image point 23, the particle beam or electron beam 22 is returned to raster image point 23 or a further raster point in raster row 21 or raster column 25 that is located before raster image point 23 (e.g., the first raster image point of raster row 21 or raster column 25, i.e., the start of a raster row or a raster column). The same applies for the frame integration, in which case it is also provided that the particle beam is returned to raster image point 23 itself, or it is returned to a further raster point in the frame located before raster image point 23 (e.g., the beginning of one of the raster rows 21 or raster columns 25). In all of the exemplary embodiments, scanning is restarted after the return.

As mentioned above, once it is determined that a change has occurred in the particle current or the electron current, the particle current or electron current is changed to a setpoint value. This ensures that the newly created images have no abrupt changes in brightness, and that they are neither too light nor dark. This is an advantage in particular when automatic adjustment of the image brightness is used. Good image quality without any abrupt changes in brightness is always ensured via the method described according to the present invention of returning the particle beam and repeating the scanning procedure.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A method for producing an image of an object using a particle beam that is scanned over the object, comprising:
   determining a parameter that is assigned to the particle beam;
   determining whether a change has occurred in the parameter;
   determining a location on the object at which the change occurred in the parameter;
   returning the particle beam to the location; and
   rescanning the particle beam over the object from the location onward.

2. The method as recited in claim 1, wherein the parameter is changed to a setpoint value.

3. The method as recited in claim 1, wherein the parameter is integrated over a specified period of time, and wherein the method further comprises:
   determining whether a change has occurred in the parameter.

4. The method as recited in claim 1, wherein the particle beam is scanned over the object from a first point of a specified pattern to a second point of the specified pattern, and wherein, if determined that a change has occurred in the parameter, the particle beam is not returned during the scanning process until the particle beam has reached the second point of the specified pattern.

5. The method as recited in claim 4, wherein at least one of: a row and a column is used as the specified pattern.

6. The method as recited in claim 1, wherein a current of the particle beam is determined as the parameter.

7. The method as recited in claim 1, wherein the particle beam is scanned over the object using a scanner which is controlled by an evaluation unit.

8. The method as recited in claim 7, wherein at least one of: the parameter and the location is determined via the evaluation unit.

9. The method as recited in claim 1, wherein the particle beam is an electron beam, and wherein the electron beam is scanned over the object.

10. The method as recited in claim 1, wherein the particle beam is produced using at least one of: a cold field emitter and a deposited field emitter.

11. The method as recited in claim 1, wherein a threshold value of the change in the parameter is settable.

12. A method for producing an image of an object using a particle beam that is scanned over the object, comprising:
   determining a parameter that is assigned to the particle beam;
   determining whether a change has occurred in the parameter;
   determining a location on the object at which the change occurred in the parameter;
   returning the particle beam to the location; and
   rescanning the particle beam over the object from the location onward, wherein the particle beam is guided to at least one raster point, at which an integrating measurement is carried out, and wherein the particle beam is returned to the raster point if the raster point is the location at which the change occurred in the parameter.

13. A method for producing an image of an object using a particle beam that is scanned over the object, comprising:
   determining a parameter that is assigned to the particle beam;
   determining whether a change has occurred in the parameter;
   determining a location on the object at which the change occurred in the parameter;
   returning the particle beam to the location; and
   rescanning the particle beam over the object from the location onward, wherein, when a change has occurred in the parameter, at least one of: an image brightness and an image contrast is adjusted.

14. A device for producing an image of an object using a particle beam that is scanned over the object, comprising:
   at least one particle beam generator for producing a particle beam;
   at least one scanner for scanning the particle beam over the object;
   at least one parameter determining device for determining a parameter that is assigned to the particle beam;
   at least one change determining device for determining that a change has occurred in the parameter;
   at least one location determining device for determining a location on the object at which the change occurred in the parameter; and
   at least one returning device for returning the particle beam to the location.

15. The device as recited in claim 14, wherein a controller is provided for changing the parameter to a setpoint value.

16. The device as recited in claim 14, wherein the returning device for returning the particle beam is integrated in the scanner.

17. The device as recited in claim 14, wherein the returning device for returning the particle beam and the scanner are identical.

18. The device as recited in claim 14, wherein the parameter determining device for determining the parameter assigned to the particle beam determines the particle beam current.

19. The device as recited in claim 14, wherein the parameter determining device for determining the parameter assigned to the particle beam is at least one of: located between the particle beam generator and the object and integrated in the particle beam generator.

20. The device as recited in claim 14, wherein the change determining device for determining that a change has occurred in the parameter is accommodated in the location determining device for determining the location.

21. The device as recited in claim 14, wherein the change determining device for determining that a change has occurred in the parameter and the location determining device for determining the location are identical.

22. The device as recited in claim 14, wherein at least two of: the parameter determining device for determining the parameter, the change determining device for determining that a change has occurred in the parameter, the location determining device for determining the location on the object, and the returning device for returning the particle beam are connected to each other.

23. The device as recited in claim 15, wherein the controller for changing the parameter is connected to the particle beam generator.

24. The device as recited in claim 14, wherein at least one of: the parameter determining device for determining the parameter, the change determining device for determining that a change has occurred in the parameter, and the location determining device for determining the location on the object is located in an evaluation unit.

25. The device as recited in claim 14, wherein the particle beam generator is at least one of an electron source, a cold field emitter, and a miniaturized cold field emitter.

26. The device as recited in claim 14, wherein the device is an electron beam device.

27. The device as recited in claim 14, further comprising:
a setting device for setting a threshold value with regard to the change in the parameter.

28. The device as recited in claim 14, further comprising:
a measuring device for performing an integrating measurement.

29. A device for producing an image of an object using a particle beam that is scanned over the object, comprising:
at least one particle beam generator for producing a particle beam;
at least one scanner for scanning the particle beam over the object;
at least one parameter determining device for determining a parameter that is assigned to the particle beam;
at least one change determining device for determining that a change has occurred in the parameter;
at least one location determining device for determining a location on the object at which the change occurred in the parameter;
at least one returning device for returning the particle beam to the location; and
an adjustment device for adjusting at least one of: an image brightness and an image contrast.

30. An electron beam device for producing an image of an object using an electron beam that is scanned over the object, comprising:
at least one electron beam generator for producing an electron beam;
at least one objective lens for focusing the electron beam on the object;
at least one scanner for scanning the electron beam over the object;
at least one parameter determining device for determining a parameter that is assigned to the electron beam;
at least one change determining device for determining that a change has occurred in the parameter;
at least one location determining device for determining a location on the object at which the change occurred in the parameter; and
at least one returning device for returning the electron beam to the location.

31. The electron beam device as recited in claim 30, further comprising:
a controller for changing the parameter to a setpoint value.

32. A method for producing an image of an object using a particle beam that is scanned over the object, comprising:
determining a parameter that is assigned to the particle beam before the particle beam is scanned over the object;
determining whether a change has occurred in the parameter;
determining a location on the object at which the change occurred in the parameter;
returning the particle beam to the location if the change in the parameter exceeds a predefined threshold; and
rescanning the particle beam over the object from the location onward.

* * * * *